(12) United States Patent
Roessler et al.

(10) Patent No.: US 10,541,261 B2
(45) Date of Patent: Jan. 21, 2020

(54) OPTICAL SENSOR DEVICE HAVING A DEPLETED DOPING REGION ADJACENT TO A CONTROL ELECTRODE AND METHOD FOR MANUFACTURING THE OPTICAL SENSOR DEVICE

(71) Applicants: Infineon Technologies AG, Neubiberg (DE); pmdtechnologies ag, Siegen (DE)

(72) Inventors: Robert Roessler, Siegen (DE); Henning Feick, Dresden (DE); Matthias Franke, Haiger (DE); Dirk Offenberg, Dresden (DE); Stefano Parascandola, Dresden (DE); Jens Prima, Siegen (DE)

(73) Assignees: Infineon Technologies AG (DE); pmdtechnologies ag (DE)

( * ) Notice: Subject to any disclaimer, the term of this patent is extended or adjusted under 35 U.S.C. 154(b) by 58 days.

(21) Appl. No.: 15/783,071

(22) Filed: Oct. 13, 2017

(65) Prior Publication Data

US 2018/0108692 A1 Apr. 19, 2018

(30) Foreign Application Priority Data

Oct. 14, 2016 (DE) .................. 10 2016 220 161
Feb. 21, 2017 (DE) .................. 10 2017 202 754

(51) Int. Cl.
*H01L 27/146* (2006.01)
*G01S 17/08* (2006.01)
(Continued)

(52) U.S. Cl.
CPC ........ *H01L 27/14609* (2013.01); *G01S 17/08* (2013.01); *H01L 23/481* (2013.01);
(Continued)

(58) Field of Classification Search
CPC ............ H01L 27/14609; H01L 31/101; H01L 31/02325; H01L 31/02024;
(Continued)

(56) References Cited

U.S. PATENT DOCUMENTS 7,709,869 B2 * 5/2010 Kuroda ............. H01L 27/14603
257/257
2009/0215221 A1 * 8/2009 Yoo ................... H01L 27/14609
438/97

(Continued)

*Primary Examiner* — William F Kraig
*Assistant Examiner* — Vicki B. Booker
(74) *Attorney, Agent, or Firm* — Design IP

(57) ABSTRACT

An optical sensor device includes a semiconductor substrate including a conversion region to convert an electromagnetic signal into photo-generated charge carriers, a read-out node configured to read-out a first portion of the photo-generated charge carriers, a control electrode, which is formed in a trench extending into the semiconductor substrate, and a doping region in the semiconductor substrate, where the doping region is adjacent to the trench, where the doping region has a doping type different from the read out node, and where the doping region has a doping concentration so that the doping region remains depleted during operation.

28 Claims, 10 Drawing Sheets

(51) Int. Cl.
*H01L 23/48* (2006.01)
*H01L 31/02* (2006.01)
*H01L 31/0232* (2014.01)
*H01L 31/101* (2006.01)

(52) U.S. Cl.
CPC .. *H01L 27/14636* (2013.01); *H01L 31/02024* (2013.01); *H01L 31/02325* (2013.01); *H01L 31/101* (2013.01)

(58) Field of Classification Search
CPC ............ H01L 27/14636; H01L 23/481; H01L 27/144; H01L 27/146; H01L 27/14601; H01L 27/14612; H01L 27/14614; H01L 27/14616; H01L 31/112; H01L 31/1127; H01L 31/1129; H01L 31/02; H01L 31/0232; H01L 31/02019; H01L 27/14683; H01L 27/14603; G01S 7/4914; G01S 17/36; G01S 17/08; G01S 7/4913; G01S 7/4912; G01S 7/491; G01S 7/48; G01S 17/00; G01S 17/32; G01S 17/06; G01S 17/02; G01S 17/89
See application file for complete search history.

(56) References Cited

U.S. PATENT DOCUMENTS

2014/0374808 A1* 12/2014 Franke .............. H01L 27/14614
  257/290
2017/0332024 A1* 11/2017 Feick ................ H01L 27/14614

* cited by examiner

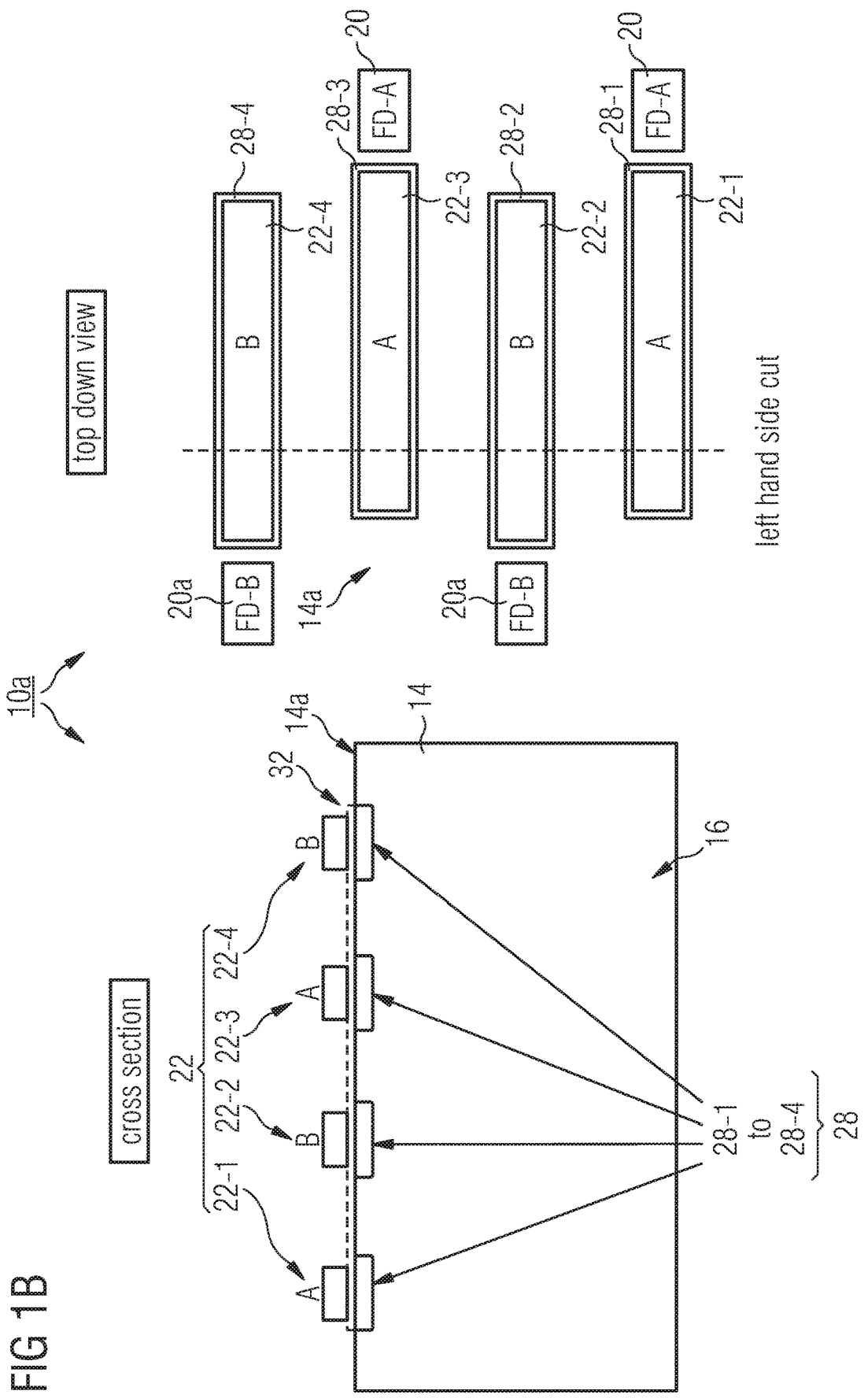

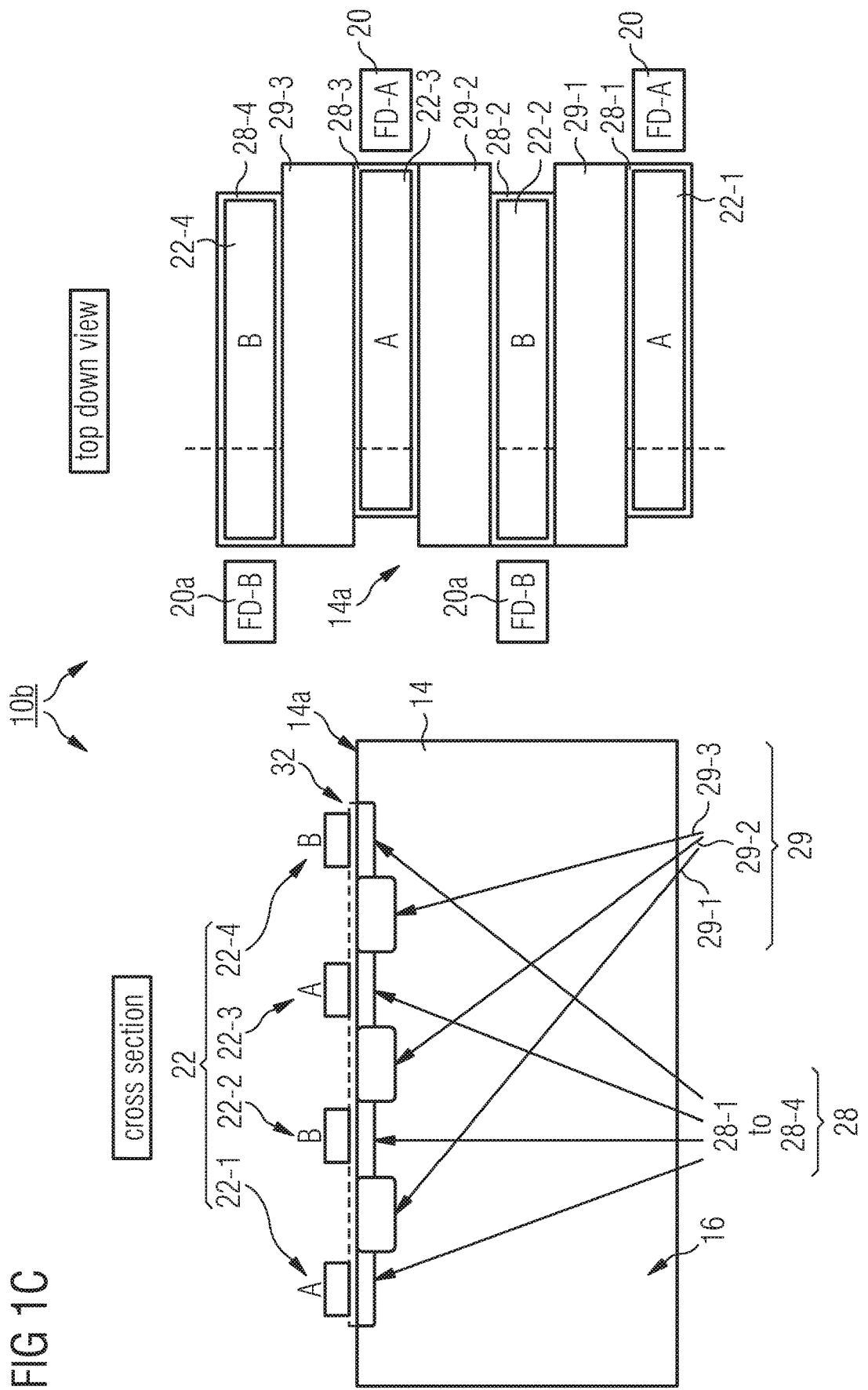

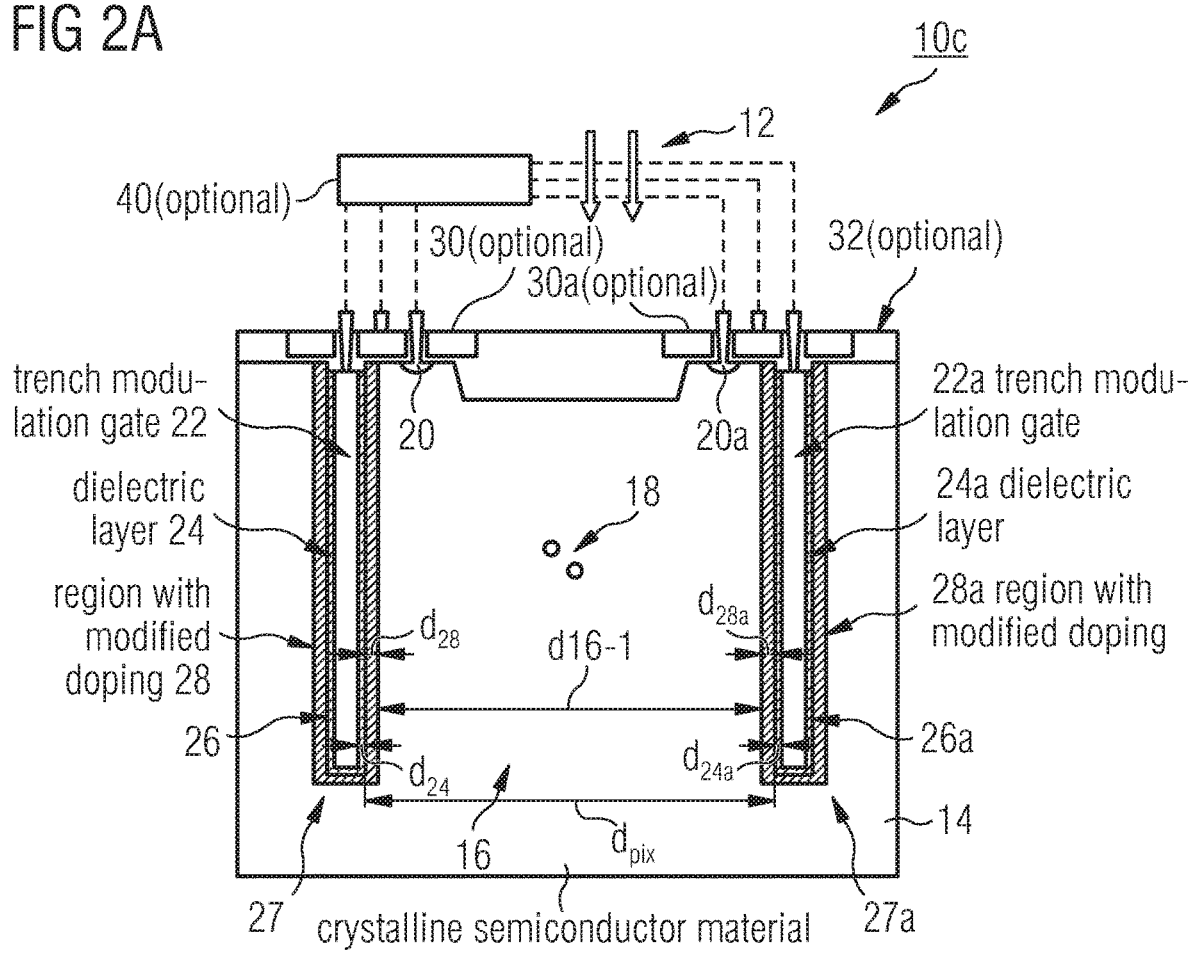

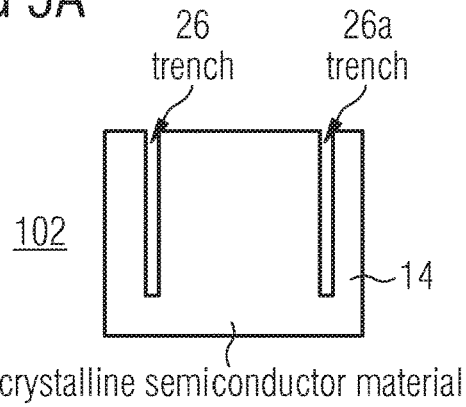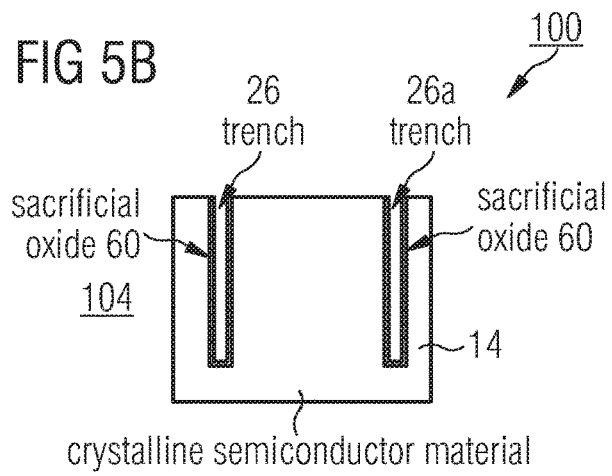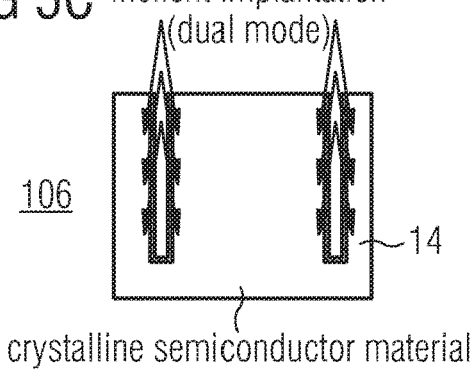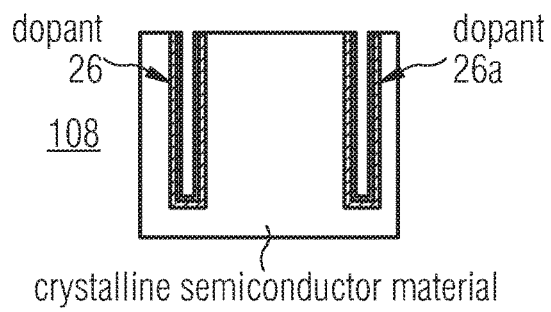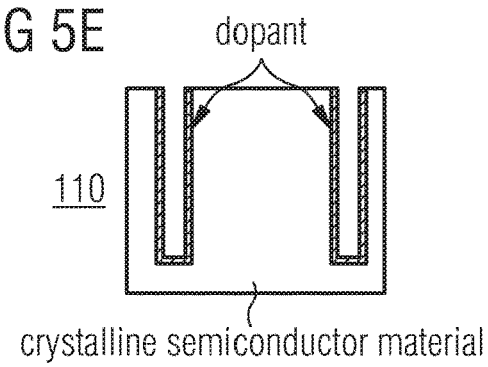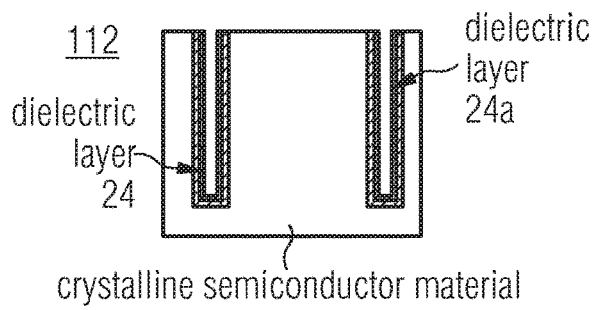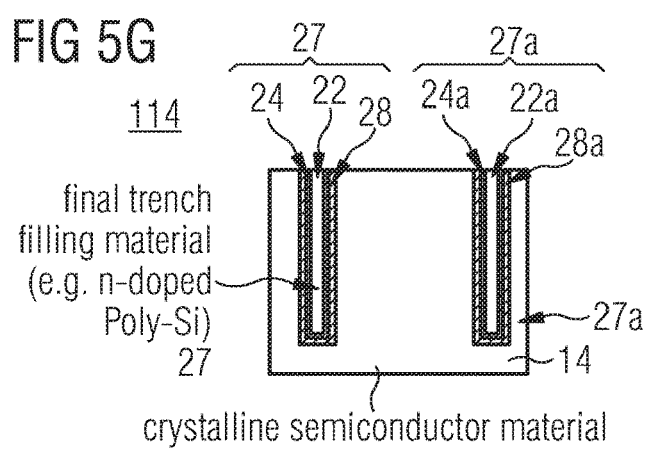

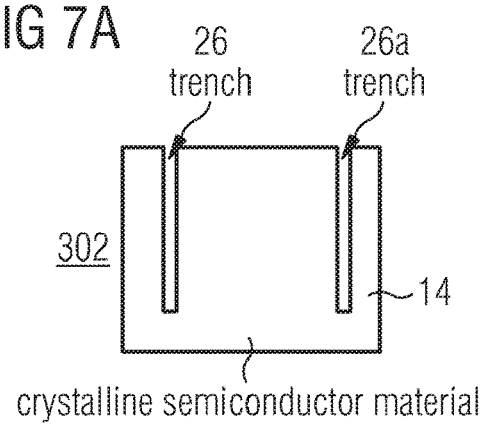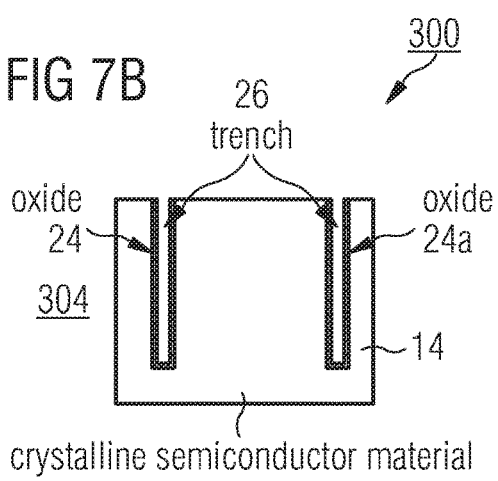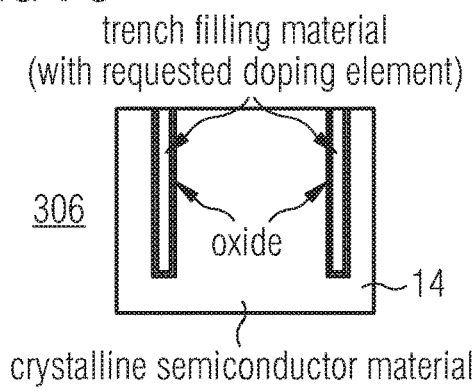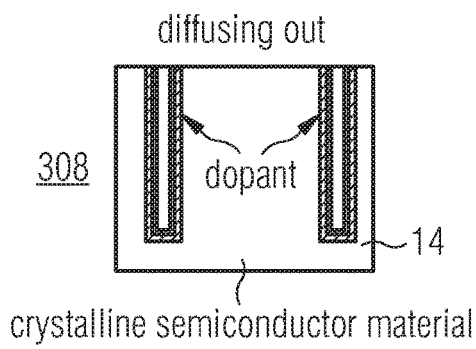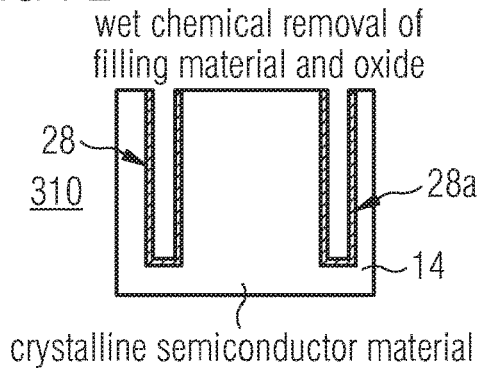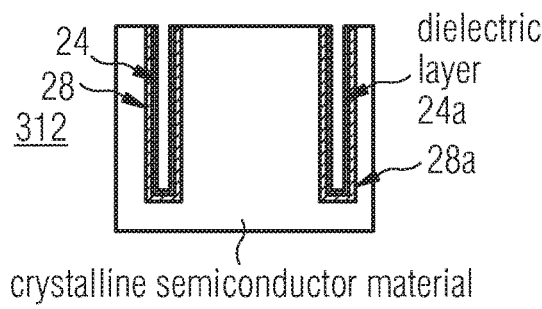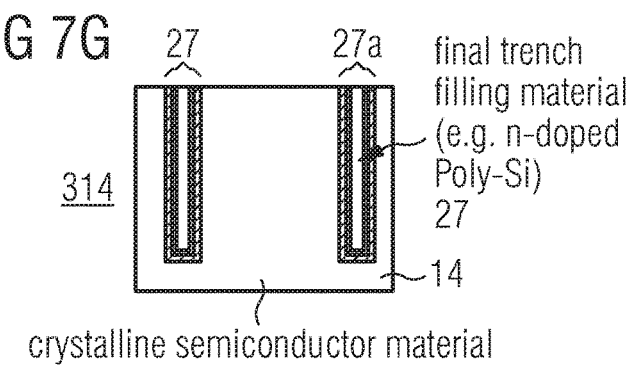

OPTICAL SENSOR DEVICE HAVING A DEPLETED DOPING REGION ADJACENT TO A CONTROL ELECTRODE AND METHOD FOR MANUFACTURING THE OPTICAL SENSOR DEVICE

FIELD

This disclosure relates in general to the field of integrated circuits, and, more specifically, to the field of optical sensor devices adapted to detect a time of flight of an electromagnetic signal. Further embodiments are directed to a photo-mixing device for a time-of-flight sensor.

BACKGROUND

In some optical sensor devices, control electrodes in a photo detector are used to demodulate photo-generated charge carriers. An electromagnetic signal generated by a radiation source and amplitude-modulated by a modulation signal is directed to an object and reflected to the photo detector. A demodulation signal in phase with the modulation signal or having a fixed phase relationship to the modulation signal is applied to the control electrodes in the photo detector. The photo-generated charge carriers are directed to a first readout node or a second readout node depending on the demodulation signal applied to the control electrodes. The photo-generated charge carriers directed to the readout nodes are detected and a phase-shift between the modulation signal and the electromagnetic signal reflected from the object and detected at the photo detector is determined. Therefore, the time of flight of the electromagnetic signal may be determined from the detected photo-generated charge carriers. In other words, mixing of the received radiation with the demodulation signal is used to determine time of flight information from the phase-shift between the radiation emitted by the radiation source and the radiation received by the optical sensor device. Thus, such optical sensor devices are also called photo-mixing devices (PMD) or demodulating detectors.

To direct the photo-generated charge carriers, control electrodes are used. In conventional sensor devices, a single kind of control electrodes is used. To be more specific, either photo-gates, or trench gates, or guide field electrodes for a current-assisted photonic demodulation, have been used.

However, the current design of optical sensor devices suffers from limitations of the quality of the sensor signal.

Therefore, an enhanced approach of converting the received optical signal in an electrical signal may be desired.

SUMMARY

Further embodiments provide for an optical sensor device comprising a semiconductor substrate having a conversion region to convert an electromagnetic signal into photo-generated charge carriers, a read-out node configured to read-out a first portion of the photo-generated charge carriers, a control electrode, and a doping region in the semiconductor substrate between the control electrode and the conversion region, wherein the doping region is adjacent to the control electrode and extends into the semiconductor substrate, wherein the doping region has a doping type different from the read out node, and wherein the doping region has a doping concentration so that the doping region remains depleted during operation.

According to one or more embodiments, the control electrode may include a control electrode section which extends laterally on a surface area of the semiconductor substrate, and wherein the doping region in the semiconductor substrate is adjacent to the lateral extending control electrode section.

According to one or more embodiments, the optical sensor device may include a control electrode having a control electrode section which is formed in a trench extending into the semiconductor substrate, and wherein the doping region is adjacent to the trench.

According to one or more embodiments, the control electrode may include a control electrode section, which extends laterally on a surface area of the semiconductor substrate, and a control electrode section, which is formed in a trench extending into the semiconductor substrate, wherein the doping region is adjacent to the control electrode sections.

Further embodiments provide for an optical sensor device comprising a semiconductor substrate comprising a conversion region to convert an electromagnetic signal into photo-generated charge carriers, a read-out node configured to read-out a first portion of the photo-generated charge carriers, a control electrode, which is separated by a further isolating material from the semiconductor substrate and which is formed in a trench extending into the semiconductor substrate, and a doping region in the semiconductor substrate, wherein the doping region is adjacent to the trench, and wherein the doping region has a doping type different from the read out node, wherein the doping region has a doping concentration so that the doping region remains depleted during operation.

According to one or more embodiments, the optical sensor device may be regarded, for example, as a pixel of a two-dimensional integrated pixel array for receiving optical visible or infrared radiation emitted by a light source and reflected by an object to be sensed where the respective pixels are integrated into a semiconductor substrate and provide an electrical output signal for determining a distance to the object by measuring the time-of-flight (travelling time) of the optical visible or infrared radiation. According to one or more embodiments, the semiconductor material of the semiconductor substrate of the optical sensor device (e.g. a PMD pixel=Photonic Mixer Device pixel) is provided with a (increased) p-type doping in regions bordering on the control electrodes which are formed in a trench extending into the semiconductor substrate and/or realized as lateral electrodes. The doping concentration of these additional p-type doping regions is above the doping concentration of the main portion (the portion having the highest volume amount) of the photo-active semiconductor material (the conversion region) but below a doping concentration in the semiconductor material where the respective doping region would no longer completely depleted during (normal) operation conditions of the optical sensor device. The effect of this additional doping region is such that the in-phase spatial separation of the photo-generated charge carriers is maintained even across several modulation periods. Thus, photo-generated charge carriers collected once at the respective modulation gates (control electrodes) are not "repelled" again. By means of the respective p-type doping regions, the performance of a PMD pixel is improved. In particular, the improved demodulation contrasts are obtained even at high modulation frequencies, e.g. in a frequency range between 80 to 250 MHz.

The following description of embodiments of the optical sensor device is equally applicable to complementary doping types.

According to one or more embodiments, the optical sensor device may further include a further read-out node configured to read-out a second portion of the photo-generated charge carriers, a further control electrode, which is separated by a further isolating material from the semiconductor substrate, wherein the further control electrode and the further isolating material are formed in a further trench extending into the semiconductor substrate, and a further doping region in the semiconductor substrate, wherein the further doping region borders the further trench with the control electrode, and wherein the further doping region has the same doping type as the conversion region and has a higher doping concentration than the conversion region, wherein, in a plan view of the semiconductor substrate, a lateral extension of the further doping region is less than 20% of a lateral extension of the conversion region.

The further doping region is arranged to adjoin the further trench, wherein, in a plan view of the semiconductor substrate, the conversion region is arranged between the control electrode and the further control electrode.

The further doping region has a doping concentration so that the further doping region remains depleted during (normal) operation conditions of the optical sensor device. The doping region and the further doping region have the same doping concentration. In a plan view of the semiconductor substrate, the lateral extension of the doping region and the lateral extension of the further doping region is less than 20% (15%, 10%, 5% or 1%) of the distance between two trenches. In a plan view of the semiconductor substrate, the control electrode and the further control electrode, and the readout node and the further readout node may be arranged symmetrically with respect to an axis of symmetry.

The controller may be configured to apply to the first control electrode varying electrical potentials having a phase shift when compared to the varying electrical potentials applied to the second control electrode, to generate electric potential distributions in the conversion region, by which the photo-generated charge carriers in the conversion region are directed in different directions dependent on the time of flight of the electromagnetic signal. The readout node is configured to detect a first portion, the further readout node is configured to detect the second portion of the directed charge carriers. Thus, the controller may be configured to determine the run time of the electro-magnetic signal based on a relationship of the amount of charge carriers collected at the first readout node and/or the amount of charge carriers collected at the second readout node.

BRIEF DESCRIPTION OF THE DRAWINGS

Embodiments are described herein subsequently making reference to the appended figures, wherein:

FIG. 1B shows a schematic cross-sectional view and a plan view of an optical sensor device according to a further embodiment;

FIG. 1C shows a schematic cross-sectional view and a plan view of an optical sensor device according to a further embodiment;

FIG. 2A shows a schematic cross-sectional view of an optical sensor device according to a further embodiment;

FIGS. 5A-5G show an exemplary method of manufacturing control electrodes in respective trenches in a semiconductor substrate;

FIGS. 7A-7G show a further exemplary method of manufacturing control electrodes in respective trenches in a semiconductor substrate.

Figure 1A:
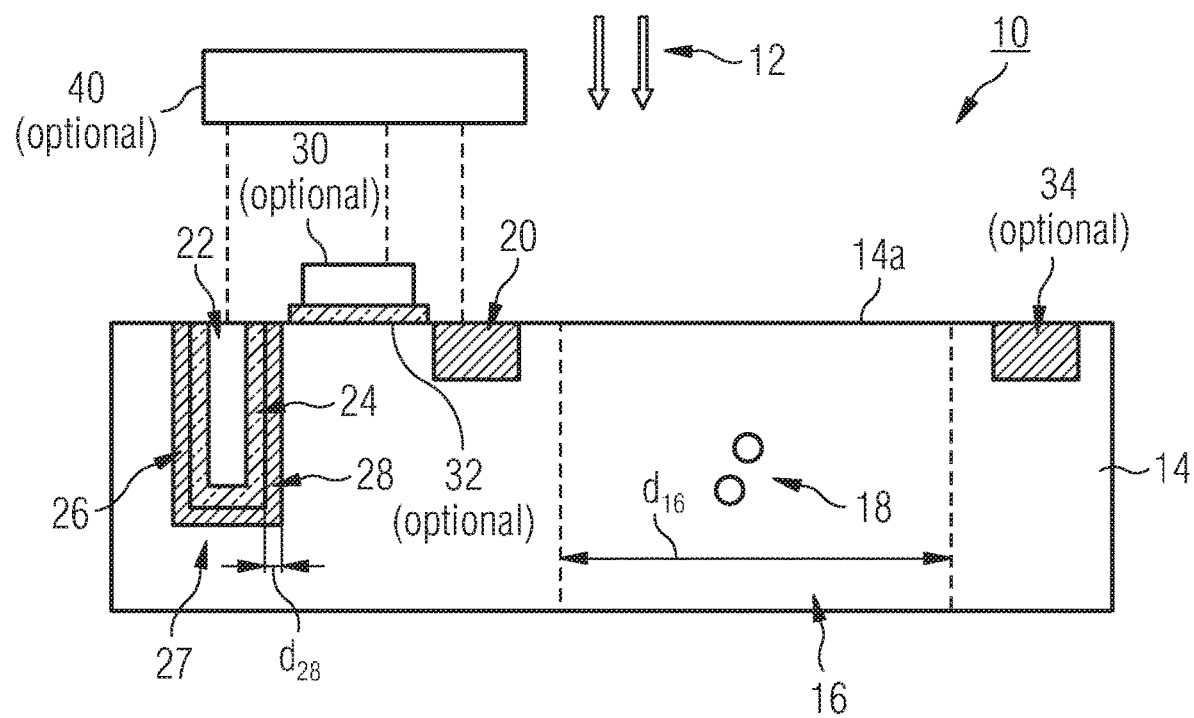
FIG. 1A shows a schematic cross-sectional view of an optical sensor device according to an embodiment.

Before discussing the embodiments in further detail using the drawings, it is pointed out that in the drawings and the specification, identical elements and elements having the same functionality and/or the same technical or physical effect are usually provided with the same reference number or are identified with the same name/term so that the description of these elements and of the functionality thereof as illustrated in the different embodiments is mutually exchangeable and may be applied to one another in the different embodiments.

DETAILED DESCRIPTION

In the following description, embodiments are discussed in detail, however, it should be appreciated that the different embodiments provide many applicable concepts that can be embodied in a wide variety of optical sensor devices. The specific embodiments discussed are merely illustrative of specific ways to make and use the present concept, and do not limit the scope of the claims. Moreover, features of the different embodiments described herein in different embodiments may be combined with each other, unless specifically noted otherwise.

FIGS. 1A-1C show embodiments of an optical sensor device 10, 10a, 10b which comprise a semiconductor substrate 14 having a conversion region 16 to convert an electromagnetic signal 12, into photo-generated charge carriers 18, a read-out node 20 configured to read-out a first portion of the photo-generated charge carriers 18, a control electrode 22, a doping region 28 in the semiconductor substrate 14 between the control electrode 22 and the conversion region 12, wherein the doping region 28 is adjacent to the control electrode 22 and extends into the semiconductor substrate 14. The doping region 28 has a doping type different from the read out node 20, wherein the doping region 28 has a doping concentration so that the doping region 28 remains depleted during operation. The control electrode 22 is separated by an isolating material 24 from the semiconductor substrate 14.

According to one or more embodiments, FIG. 1A shows the optical sensor device 10, wherein the control electrode 22 comprises a control electrode section which is formed in a trench 26 extending into the semiconductor substrate 14, and wherein the doping region 28 is adjacent to the trench 26. A projection of a surface area of the control electrode 22 towards the conversion region 16 is located in the doping region 28. In FIG. 1A the projection towards the conversion region 16 is, essentially, a projection in the lateral direction with respect to the surface area 14a of the semiconductor substrate 14.

According to one or more embodiments, FIG. 1B shows the optical sensor device 10a, wherein the control electrode 22 comprises a control electrode section which extends laterally on a surface area 14a of the semiconductor substrate 14, and wherein the doping region 28 in the semiconductor substrate 14 is adjacent to the lateral extending control electrode section.

According to one or more embodiments, FIG. 1C shows the optical sensor device 10c which further comprises shallow doped regions 29-1, 29-2, 29-3 (29) between neighboring lateral extending control electrode sections, wherein the shallow doped regions 29-1, 29-2, 29-3 have a higher doping concentration than the doping region 28. A projection of a surface area of the control electrode 22 towards the conversion region 16 is located in the doping region 28. In FIG. 1B-c, the projection towards the conversion region 16 is, essentially, a projection in the vertical direction with respect to the surface area 14a of the semiconductor substrate 14. In a vertical projection with respect to the surface area 14a of the semiconductor substrate 14, the boundary of the control electrode 22 may be located within the boundary of the doping region 28.

To be more specific, FIG. 1A shows a schematic cross-sectional view of the optical sensor device 10 (e.g. a PMD pixel), such as an optical time-of-flight sensor device for detecting a time of flight (runtime) of an electromagnetic signal, such as a light signal in the optical or infrared radiation range, from an object to be sensed to the optical sensor device. In the figures, the electromagnetic signal/radiation incident onto the optical sensor device 10 is indicated by an arrow 12.

The optical sensor device comprises a semiconductor substrate 14. The semiconductor substrate 14 comprises a conversion region 16 to convert the portion of the electromagnetic signal 12, which enters the conversion region 16, into photo-generated charge carriers 18 where conversion region 16 is generally the region of the semiconductor substrate 14 in which the electromagnetic signal 12 is received. In the conversion region 16, the electromagnetic signal 12 is converted into photo-generated charge carriers 18.

The optical sensor device 10 further comprises a readout node 20 configured to readout or detect a first portion of the photo-generated charge carriers 18. The optical sensor device 10 further comprises a control electrode (modulation gate) 22 which is formed in a trench 26 extending into the semiconductor substrate 14. The control electrode 22 is separated by an isolating material 24 from the semiconductor substrate 14 and may be separated from the conversion region 16. The trench 26 with the control electrode 22 may also directly border to the conversion region 16. The control electrode 22 and the isolating material 24 are formed in the trench 26 extending (e.g. vertically from the main surface region 14a of the semiconductor substrate 14) into the semiconductor substrate 14. The control electrode 22 arranged together with the isolating material 24 in the trench 26 may also be referred to as a trench gate control electrode or modulation gate 27.

The readout node 20 may be arranged in the semiconductor substrate 14 adjacent to the conversion region 16. Moreover, the optical sensor device 10 comprises a doping region 28 in the semiconductor substrate 14 wherein the doping region 28 is adjacent or borders on the trench 26 with the control electrode 22 (and the isolation material 24), and wherein the semiconductor material of the doping region 28 has a doping type different from the semiconductor material of the read out node (20). The doping region 28 may have the same doping type as the semiconductor material of the conversion region 16 and has a higher (average or peak) doping concentration or doping level than the conversion region 16. Thus, the doping region 28 (at least partially) adjoins or surrounds the trench 26 with the control electrode 22. The doping region 28 has a doping concentration so that the doping region 28 remains depleted during operation. Thus, the doping region 28 may have a doping concentration, e.g. an "average" (or peak) doping concentration or doping level, so that the doping region 28 remains depleted during operation, i.e. during "normal" operation conditions of the optical sensor device 10. The (average) doping concentration of the doping region 28 is, by a factor less than 1000, 990 (or 900, 800) higher than the (average) doping concentration of the conversion region 16.

In a plane view onto the main surface region 14a of the semiconductor substrate 14, a lateral extension "$d_{28}$" of the doping region 28 may be chosen to be less than 20% (15%, 10%, 5% or 1%) of the lateral extension $d_{16}$ of the conversion region 16. In other words, the doping region 28 has a thickness or width $d_{26}$ which is less than 20% of the lateral extension $d_{16}$ of the conversion region 16.

Moreover, in a plane view (to the main surface region 14a) of the semiconductor substrate, the doping region 28 is arranged between the control electrode 22 (or the trench 26) and the conversion region 16, and wherein the doping region 28 is arranged to (e.g. directly) adjoin or about the trench 26 in the semiconductor substrate 14.

Moreover, the optical sensor device 10 may (optionally) comprise a separation gate 30 which is separated by an (optional) isolating material 32 from the semiconductor substrate 14. A substrate contact 34, for example, an enhanced doping region, may be optionally provided in the semiconductor substrate 14. The readout node 20 may comprise the first doping type (e.g. n-doping type) wherein the doping region 28 and the substrate contact 34 may comprise the second doping type (e.g. p-doping type).

The (optional) separation gate 30 may allow for a capacitive decoupling of the control electrode 22 and the readout node 20 respectively, to prevent a crosstalk or biasing from the control electrode 22 to the readout node 20. In some embodiments, in a plane view to the main surface region 14a of the semiconductor substrate 14, a projection of the separation gate 30 into the semiconductor substrate 14 is at least partially located between the trench 26 (or the modulation gate 27) and the readout node 20. However, as shown below with respect to FIG. 2A, further configurations and arrangements of the separation gate 30 can be implemented.

The optical sensor device 10 may be configured to detect a time of flight of the electromagnetic signal 12, which enters the conversion region 16. To this end, the optical sensor device 10 may further comprise a controller 40 which may be configured to apply to the control electrode 22 a varying potential, to generate electrical potential distributions in the conversion region 16, by which, the photo-generated charge carriers 18 in the conversion region 16 are directed in different directions (e.g. towards the doping region 28) dependent on the time of flight of the electromagnetic signal 12, which enters the conversion region 16. During operation, the first portion of the photo-generated charge carriers is temporarily stored in the doping region 28 for a least one complete cycle of the varying potential.

Thus, the readout node 20 is configured to detect or sense a first portion of the directed charge carriers 18, e.g. at least partially the minority charge carriers in the conversion region 16. The varying potential, applied by the controller 40 to the control electrode 22 is a demodulation signal having a fixed phase relationship with a modulation signal with which the electromagnetic signal 12 is modulated.

In embodiments, the conversion region 16 may be a lightly doped semiconductor region. For example, the conversion region may be p-type doped. The readout node(s) disclosed herein may be formed by a doped region having a higher doping concentration and a different doping type than the conversion region. If the doping region 28 is p-type doped, the readout node 20 may be $n^+$-doped. Thus, the readout nodes 20 as described herein may be formed as readout diodes. In operation, a reverse voltage may be applied to the readout node 20. The reverse voltage may be applied by means of the controller 40. In addition, varying in-phase potentials may be applied to the control electrode. The varying potentials at the control electrode may be lower than the reverse voltage applied to the readout node 20. For example, a reverse voltage in the order of 2.8 V may be applied to the readout node 20, and the varying potential applied to the control electrode(s) may vary between 0 V and 0.8 V.

When applying the potential to the control electrode 22, electrical potential distributions are generated in the semiconductor substrate, by which photo-generated minority charge carriers are moved in the direction towards the respective control electrode and, therefore, towards the respective readout node 20. Deflection of the photo-generated minority charge carriers is larger during phases in which the varying potential is higher, and lower during phases in which the varying potential is lower. Thus, the number of photo-generated minority charge carriers arriving at the readout node 20 will depend on the phase relationship between the emitted electromagnetic signal and the received electromagnetic signal 12. Thus, the time of flight of the electromagnetic signal from the object to the optical sensor device and, therefore, the distance of the object from the optical sensor device may be determined by detecting the (directed) photo-generated charge carriers arriving at the readout node(s).

In embodiments, the control electrode 22 (with the surrounding isolating material 24) is a trench gate electrode 27. In case of a p type semiconductor substrate, a varying positive voltage may be applied to the trench gate electrode 27. Thus, a depletion region (space charge region) may be generated in the region of the semiconductor substrate 14 surrounding the trench gate electrode 27. Photo-generated minority charge carriers may be attracted in a lateral direction toward the trench gate electrode 27 and then moved in a vertical direction toward the readout node 20 through the depletion region. Accordingly, photo-generated minority charge carriers generated in deeper parts of the conversion region 16 may be attracted by the potential applied to the control electrode 22, may enter the depletion region forced by applying the varying potential to the deep control electrode and are moved within the depletion region of the deep control electrode vertically toward the readout node 20.

According to one or more embodiments, the semiconductor material of the semiconductor substrate 14 of the optical sensor device 10 is provided with an increased p-type doping in regions 28 bordering on the trench 26 with the control electrode 22. The doping concentration of these additional p-type doping regions 28 is above the doping concentration of the main portion (the portion having the highest volume amount) of the photo-active semiconductor material 16, i.e. the conversion region 16, but below a doping concentration in the semiconductor material 14 where the respective doping region would no longer completely depleted during (normal) operation conditions of the optical sensor device 10. The effect of this additional doping region(s) is such that the in-phase spatial separation of the photo-generated charge carriers 18 is maintained even across several modulation periods. Thus, photo-generated charge carriers 18 collected once at the respective modulation gate (control electrode) are not "repelled" again. By means of the respective p-type doping regions, the performance of a PMD pixel is improved. In particular, the improved demodulation contrasts are obtained even at high modulation frequencies, e.g. in a frequency range between 80 to 250 MHz.

In embodiments, the separation gate electrode 30 may be arranged on the main surface region 14a of the semiconductor substrate 14 adjacent to the at least one readout node 20. In embodiments, the separation gate electrode 30 may be arranged to surround at least one readout node in a plane view of the semiconductor substrate 14. The separation gate electrode 30 may support retaining the (collected or directed) charge carriers even in case the potential applied to the control electrode(s) is removed. To this end, a constant positive potential (in case of a p-type substrate) or a constant negative potential (in case of an n-type substrate) may be applied to the separation gate electrode 30. The amplitude/magnitude of the potential applied to the separation gate electrode 30 may be less than the magnitude of the reverse voltage applied to the readout node 20 but higher than the maximum potential applied to the control electrode(s) 22.

Generally, the semiconductor substrate 14 may have a width, a length and a thickness. Generally, the term "plane view" refers to a view in the thickness direction, i.e. a view onto a plane or the main surface region 14a defined by the length and the width of the substrate 14. Generally, the term vertical may mean in the thickness direction and the term lateral may mean parallel to the plane defined by the main surface region 14a of the semiconductor substrate 14.

FIG. 1B shows a schematic cross-sectional view and a plan view of the optical sensor device 10a according to a further embodiment. The optical sensor device 10b comprises the semiconductor substrate 14 having the conversion region 16 to convert the electromagnetic signal 12 into the photo-generated charge carriers. The read-out node 20 (floating diffusion FD-A) is configured to read-out a first portion of the photo-generated charge carriers 18. A further readout node 20a (floating diffusion FD-B) is configured to read-out a second portion of the photo-generated charge carriers 18.

The lateral extending control electrode 22, which has, for example, a plurality of lateral extending control electrode sections 22-1, 22-2, 22-3, 22-4, extends laterally on a surface area 14a of the semiconductor substrate 14, wherein the doping region 28 in the semiconductor substrate 14 is adjacent to the lateral extending control electrode sections 22-1 to 22-4. The control electrode 22 may be separated from the semiconductor substrate 14 by an isolating material (isolating layer) 32. The lateral extending control electrode sections 22-1 to 22-4 may be arranged neighboring and parallel to each other on the surface area 14a of the semiconductor substrate 14.

The doping region 28 in the semiconductor substrate 14 is adjacent to the lateral extending control electrode 22. In case, the control electrode 22 has a plurality of lateral extending control electrode sections 22-1, 22-2, 22-3, 22-4, the doping region 28 may also have a plurality of lateral extending doping region sections 28-1 to 28-4, which are associated to the lateral extending control electrode sections 22-1, 22-2, 22-3, 22-4, respectively. The doping region 28 has a doping type different from the read out nodes 20, 20a, wherein the doping region 28 has a doping concentration (doping level) so that the doping region 28 remains depleted during operation (i.e. normal operation conditions).

A varying potential may be applied (e.g. by means of a controller—not shown in FIG. 1B) to the control electrode 22, to generate electric potential distributions in the conversion region 16, by which the photo-generated charge carriers 18 in the conversion region 16 are directed in different directions dependent on the time of flight of the electromagnetic signal 12 towards the doping region 28. The first portion of the photo-generated charge carriers is temporarily stored in the doping region 28 for a least one complete cycle of the varying potential.

As shown in FIG. 1B, the floating diffusion regions 20 (FD-A), 20a (FD-B) are arranged for receiving the generated photoelectric charge carriers. The floating diffusion regions 20 (FD-A), 20a (FD-B) may act as sensing node(s). The read-out node 20 (floating diffusion FD-A) is configured to read-out a first portion of the photo-generated charge carriers 18. The further readout node 20a (floating diffusion FD-B) is configured to read-out a second portion of the photo-generated charge carriers 18.

FIG. 1C shows a schematic cross-sectional view and a plan view of an optical sensor device 10b according to a further embodiment. When compared to the optical sensor device 10a of FIG. 1B, the optical sensor device 10b of FIG. 1C further comprises doped regions 29-1 to 29-3 between (neighboring) lateral extending control electrode sections 22-1 to 22-4, wherein the doped regions 29-1 to 29-3 have the same doping type as the doping region 28, but have a higher doping concentration than the doping region 28. The doped regions 29-1 to 29-3 may extend (e.g. 2 to 5-times) deeper (from the surface area 14a vertically) into the semiconductor substrate 14 than the doping region 28. The doped regions 29-1 to 29-3 have a doping concentration such that the doped regions 29-1 to 29-3 do not remain depleted during operation. Thus, at least a part of the doped regions 29-1 to 29-3 does not remain depleted during operation (i.e. normal operation conditions).

The doping region 28 and the doped regions 29-1 to 29-3 may be implemented as shallow as possible in the semiconductor substrate 14 for increasing the optical sensitivity of the optical sensor device. The doped regions 29-1 to 29-3 are effective in keeping (holding) the photo-generated charge carriers below the control electrode 22 (e.g. below the lateral extending control electrode sections 22-1 to 22-4). Thus, a lateral escaping or leaking of charge carriers can be effectively reduced without the need of providing for a further barrier arrangement.

Figure 3:
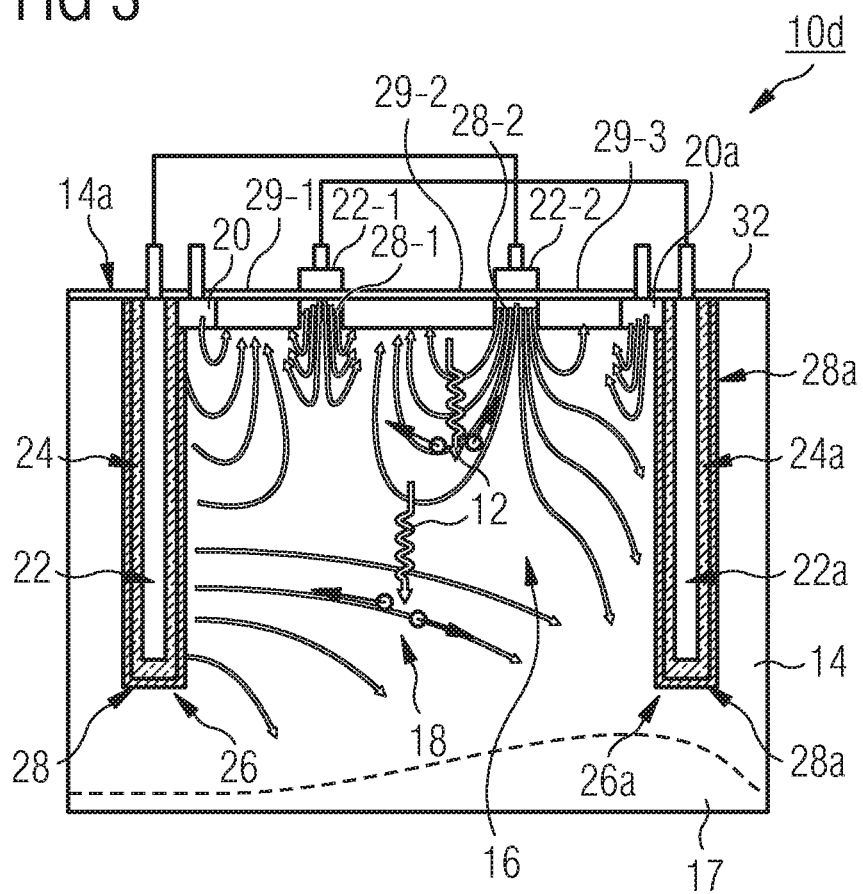
FIG. 3 shows a schematic cross-sectional view of an optical sensor device according to a further embodiment.

The vertical extending implementation of the control electrode 22 and the doping region 28 according to the embodiments of FIG. 1A and the lateral extending implementation of the control electrode 22 and the doping region 28 according to the embodiments of FIGS. 1B and 1C can also be combined in an optical sensor device (see for example the optical sensor device 10d in FIG. 3 according to a further embodiment).

FIG. 2A shows a schematic cross-sectional view of an optical sensor device 10a according to a further embodiment. The optical sensor device 10a comprises a first control electrode 22, a second control electrode 22a. The first and second control electrodes 22 and 22a are arranged in respective trenches 26, 26a and isolated from the semiconductor substrate material 14 by means of respective isolating layers 24 and 24a, respectively. The first and second control electrodes 22 and 22a surrounded by the respective isolating layers 24 and 24a may form trench gate electrodes 27, 27a. The isolating layers 24 and 24a have a thickness $d_{24}$. A first readout node 20 is arranged adjacent to the first control electrode 22, wherein a second readout node 20a is arranged adjacent to the second control electrode 22a. The optical sensor device 10a may comprise further optional first and second separation gates 30, 30a, which are separated by an isolating material 32 (e.g. a passivation layer) from the semiconductor substrate 14.

To be more specific, the optical sensor device 10a comprises a semiconductor substrate 14 comprising a conversion region 16 to convert an electromagnetic signal 12, which enters the conversion region 16, into photo-generated charge carriers 18. The optical sensor device 10a further comprises a first read-out node 20 configured to read-out a first portion of the photo-generated charge carriers 18, and second read-out node 20a configured to read-out a second portion of the photo-generated charge carriers 18.

The optical sensor device 10a further comprises a first control electrode 22, which is separated by a first isolating material 24 from the semiconductor substrate 14, wherein the first control electrode 22 and the first isolating material 24 are formed in a first trench 26 extending into the semiconductor substrate 14, and comprises a second control electrode 22a, which is separated by a second isolating material 24a from the semiconductor substrate 14, wherein the second control electrode 22a and the second isolating material 24a are formed in a second trench 26a extending into the semiconductor substrate 14.

Moreover, a first doping region 28 is arranged in the semiconductor substrate 14, wherein the first doping region 28 borders the first trench 26, and a second doping region 28a is arranged in the semiconductor substrate 14, wherein the second doping region 28a borders the second trench 26a. The first and second doping regions 28, 28a have the same doping type as the conversion region 16 and have a higher doping concentration than the conversion region 16, and wherein, in a plan view of the semiconductor substrate 14, a lateral extension $d_{28}$ of the doping regions 28, 28a is less than 20% (15%, 10%, 5% or 1%) of a lateral extension $d_{16}$ of the conversion region 16.

The first and second elements of the same type in FIG. 2A may have the same electrical and physical (or geometrical) structure and, thus, the same electrical and physical characteristics. To be more specific, the first and second control electrodes 22, 22a may have the same electrical and physical structure and, thus, the same electrical and physical characteristics. The first and second read-out nodes 20, 20a may have the same electrical and physical structure and, thus, the same electrical and physical characteristics. The first and second doping regions 28, 28a may have the same electrical and physical structure and, thus, the same electrical and physical characteristics. The optional first and second separation gates 30, 30a may have the same electrical and physical structure and, thus, the same electrical and physical characteristics.

In embodiments, the first and second doping regions 28, 28a are arranged to (e.g. directly) adjoin or abut the associated trench 26, 26a. In a plan view of the semiconductor substrate 14, the conversion region 16 is arranged between the first control electrode 22 and the further control electrode 22a.

In embodiments, the first and second doping regions 28, 28a each have a doping concentration so that the doping regions 28, 28a remains depleted during normal operation conditions of the optical sensor device 10a, wherein the first doping region 28 and the second doping region 28a may have the same doping concentration. In a plan view of the semiconductor substrate 14, the lateral extension (thickness or width) $d_{28}$ of the first doping region 28 and the lateral extension (thickness or width) $d_{28a}$ of the second doping region 28a is less than 20% (e.g. 15%, 10%, 5% or 1%) of the distance between two neighboring trenches 26, 26a. Moreover, in a plan view of the semiconductor substrate 14, the first control electrode 22 and the second control electrode 22a, and the first readout node 20 and the second readout node 20a are arranged symmetrically with respect to an axis of symmetry (e.g. a center axis of the pixel 10a). In embodiments, the doping regions 28, 28a may comprises a p-doped semiconductor material, and wherein the first control electrode 22 and the second control electrode 22a may comprise a n$^+$-doped poly-silicon material as conductive electrode material.

In embodiments, the optical sensor device 10a may further comprise a controller 40 which is configured to apply to the first control electrode 22 varying electrical potentials having a phase shift when compared to the varying electrical potentials applied to the second control electrode 22a, to generate electric potential distributions in the conversion region 16, by which the photo-generated charge carriers 18 in the conversion region 16 are directed in different directions dependent on the time of flight of the electromagnetic signal 12. Thus, the first readout node 20 is configured to detect the first portion of the directed charge carriers 18a, wherein the second readout node 20a is configured to detect the second portion of the directed charge carriers 18. The controller 40 may be configured to determine the time of flight of the electro-magnetic signal 12 based on a relationship of the amount of charge carriers 18 collected at the first readout node 20 and/or the amount of charge carriers 18 collected at the second readout node 20a.

The first and second control electrodes 22, 22a, and the first and second readout nodes 20, 20a may be electrically connected to the controller 40 as indicated in FIG. 2A by respective lines. The controller 40 may be configured to apply appropriate potentials to the respective control electrodes 22, 22a and readout nodes 20, 20a and may be configured to detect photo-generated charge carriers 18 collected at the respective readout node 20, 20a.

The controller may be configured to apply to the second control electrode varying potentials comprising a phase shift when compared to the varying potentials applied to the first control electrode. The phase shift may be 180° so that the varying potentials applied to the second control electrode is in anti-phase to the varying potentials applied to the first control electrode. Thus, electric potential distributions may be generated in the conversion region, by which the photo-generated charge carriers in the conversion region are directed (separated) in different directions dependent on the time of flight of the electromagnetic signal. Thus, separation of the photo-generated charge carriers depending on the phase difference of the modulation signal and the radiation received by the optical sensor device may be detected in an efficient and liable manner.

In embodiments, the controller 40 may be formed of any appropriate integrated circuit and may be integrated with the optical sensor device. In embodiments, the controller may be provided by an integrated circuit separate from the semiconductor substrate of the optical sensor device. In embodiments, at least parts of the controller may be formed by a microprocessor or an FPGA.

In embodiments, the optical sensor device 10a may be a time-of-flight sensor. To be more specific, the optical sensor device 10a may be regarded, for example, as a pixel of a two-dimensional integrated pixel array for receiving optical visible or infrared radiation emitted by a light source and reflected by an object to be sensed where the respective pixels are integrated into a semiconductor substrate and provide an electrical output signal for determining a distance to the object by measuring the time-of-flight (travelling time) of the optical visible or infrared radiation In the optical sensor device 10a of FIG. 2A, the "trench gates" 27, 27a (modulation gates), essentially are comprised of trenches 26, 26a in the semiconductor material 14, a dielectric 24, 24a at the walls of the trenches 26, 26a as well as a conductive electrode material 22, 22a, preferably highly doped polysilicon by which the trenches 26, 26a are filled. By applying different voltages to adjacent control electrodes 22, 22a, the horizontal deviation of the charge carriers 18 is realized. For an optimum mode of operation of the horizontal charge carrier separation, in particular at high frequencies e.g. between 80 and 250 MHz, additional p-doping regions 28, 28a are introduced in the semiconductor material 14 around the trenches 26, 26a. The concentration of this additional p-doping in the additional p-doping regions 28, 28a can be several orders (e.g. three orders) of magnitude above the concentration of the doping of the portion of the photoactive semiconductor material 16 having the greatest volume 16-1 (see FIG. 2B), but is below a concentration where the respective region would no longer be completely depleted.

Figure 2B:
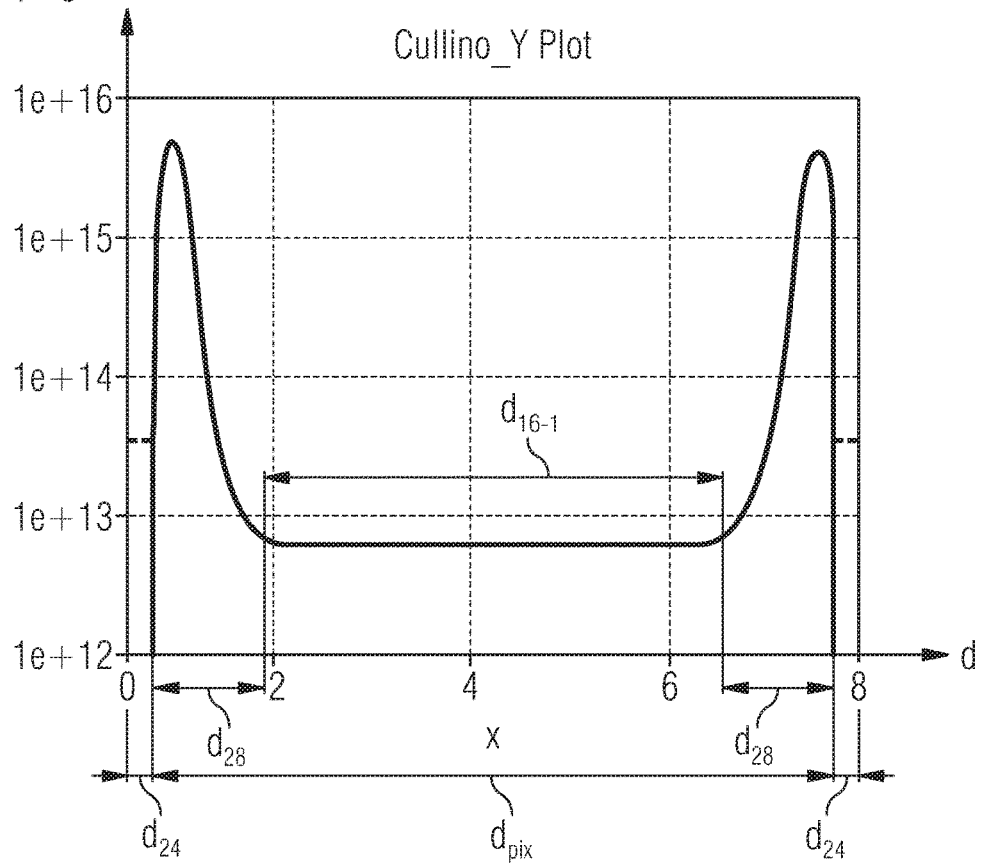
FIG. 2B shows a principal p-type doping profile for a trench gate pixel with an additional p-type doping region at both trenches according to an embodiment.

FIG. 2B shows a principal p-type doping profile for a trench gate pixel 10a with an additional p-type doping regions 28, 28a at both trenches 26, 26a according to an embodiment. To be more specific, FIG. 2 b shows a horizontal cut (sectional view) of the p-doping profile for a trench gate pixel 10a with the additional doping regions 28, 28a. In FIG. 2B, the axis of ordinate (y-axis) indicates the doping concentration in the photoactive semiconductor material 16, wherein the axis of abscissae (x-axis) indicates the distance d", (pixel width) between both trenches 26, 26a.

Figure 2C:
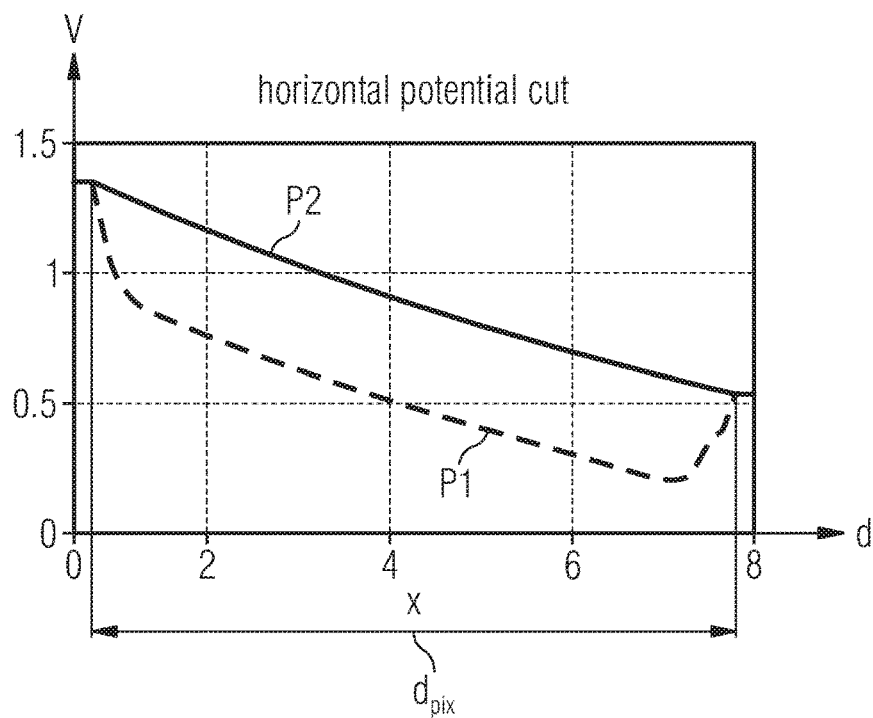
FIG. 2C shows an exemplary illustration of the eletrostatical potential for a trench gate pixel between both trench electrodes (dashed line) according to an embodiment.

FIG. 2C shows an exemplary illustration of the electrostatic potential P1 (dashed line in FIG. 2C) for a trench gate pixel 10a between both trench electrodes 26, 26a with the additional doping regions 28, 28a according to an embodiment, wherein the continuous line indicates an exemplary illustration of the electrostatic potential P2 for a trench gate pixel between the trench electrodes without additional doping regions. In FIG. 2C, the axis of ordinate (y-axis) indicates the potentials P1 and P2, wherein the axis of abscissae (x-axis) indicates the distance $d_{pix}$), (pixel width) between both trenches 26, 26a.

Introducing the additional p-type doping regions 28, 28a results in a reduction of the electrostatic potential across the entire pixel width $d_{Pix}$ without having any significant influence on the occurrence and characteristic of the so-called "charge carrier swing" (=the redirection of the photo-generated charge carriers—see also FIG. 2C). The phase-dependent redirection of the photo-generated charge carriers 18, e.g. the in-phase spatial separation of the photo-generated charge carriers, is achieved by applying a first demodulation signal (varying potential) to the first control electrode 22 (first modulation gate 27) and, optionally, by applying a second demodulation signal (varying potential) applied to the second control electrode 22a (second modulation gate 27a).

Moreover, a reduction of the potential P1 is effected at the trench 26, 26a itself, which maintains the in-phase spatial separation of the charge carriers 18 even across several modulation periods, i.e. charge carriers 18 collected once at the trench gate 27, 27a are not repelled again. The charge carriers 18 collected at the trench gates 27, 27a are subsequently drifting or diffusing in the semiconductor material close to the side walls of the trenches 26, 26a to the readout nodes (readout diodes) 20, 20a. Here, the process of vertical movement of the (minority) charge carriers 18 (electrons) is not time-sensitive with regard to the duration of a modulation period of the first order.

Thus, the optical sensor device 10a (trench gate pixel) having a pixel structure as shown in FIG. 2A with trench gates 27, 27a and p-doping regions 28, 28a introduced into the semiconductor material 14 along the trench gates 27, 27a provides for a optical sensor constellation with high sensitivities and high contrast values.

Embodiments of the disclosure may also use a quantum-efficiency modulation at the surface region of the semiconductor substrate. A schematic cross-sectional view of an embodiment an optical sensor device 10d using quantum-efficiency modulation is shown in FIG. 3. The optical sensor device 10d comprises first and second trench control electrodes 22, 22a, first and second readout nodes 20, 20a, and first and second lateral control electrodes 22-1 and 22-2. Moreover, the optical sensor device 10d shown in FIG. 3 comprises (essentially) "vertical extending" doped regions 28, 28a, and (essentially) "lateral extending" doping regions 28-1, 28-2 and doped regions 29-1, 29-2, 29-3.

The first and second control electrodes 22 and 22a are arranged in respective trenches 26, 26a and isolated from the semiconductor substrate material 14 by means of respective isolating layers 24 and 24a, respectively. The doping regions 28, 28a are arranged in the semiconductor substrate 14, wherein the first doping region 28 borders the first trench 26 in the semiconductor substrate 14, wherein the second doping region 28a borders the second trench 26a in the semiconductor substrate 14. The first and second doping regions 28, 28a have the same doping type as the conversion region 16 and have a higher doping concentration than the conversion region 16

The lateral extending control electrodes 22-1, 22-2 extend laterally on a surface area 14a of the semiconductor substrate 14, wherein the doping regions 28-1, 28-2 in the semiconductor substrate 14 are adjacent to the lateral extending control electrodes 22-1, 22-2. The control electrodes 22-1, 22-2 may be separated from the semiconductor substrate 10 by an isolating material (isolating layer) 32. The lateral extending control electrodes 22-1, 22-2 may be arranged neighboring and parallel to each other on the surface area 14a of the semiconductor substrate 14. The doping regions 28, 28a, 28-1, 28-2 have a doping type different from the read out node 20, wherein the doping regions 28, 28a, 28-1, 28-2 have a doping concentration so that the doping regions 28, 28a, 28-1, 28-2 remain depleted during operation.

The doped regions 29-1, 29-2, 29-3 have a higher doping concentration and the same doping type as the conversion region 16. The doped regions may be $p^+$ doped regions. The doped regions 29-1 is arranged between the first readout node 20 and the lateral control electrode 22-1, the doped region 29-2 is arranged between the lateral control electrode 22-1 and the lateral control electrode 22-2, and the doped region 29-3 is arranged between the lateral control electrode 22-2 and the second readout node 20a. Also shown in the schematic view of FIG. 3 is an undepleted/neutral semiconductor region 17.

According to one or more embodiments, the semiconductor material of the semiconductor substrate 14 of the optical sensor device 10d is provided with doping regions 28, 28a and 28-1, 28-2 (having, for example an increased p-type doping and) bordering on the control electrodes which are formed in a trench extending into the semiconductor substrate and/or realized as lateral electrodes. The doping concentration of these additional doping regions 28, 28a and 28-1, 28-2 is above the doping concentration of the main portion (the portion having the highest volume amount) of the photo-active semiconductor material (the conversion region 16) but below a doping concentration in the semiconductor material where the respective doping region would no longer completely depleted during (normal) operation conditions of the optical sensor device.

Typically the conversion region 16 has a doping concentration in the region of 1E12-5E14 atoms/cm^3 (1012–5*1014 atoms/cm3), the doping regions 28, 28a and 28-1, 28-2 with a peak concentration between 5E14 and 5E17 at./cm^3 (5*1014–5*1017 atoms/cm3), and the doping regions 29-1, 29-2, 29-3 with a peak concentration between 5e17 at./cm^3 and 5e21 at./cm^3 (5*1017–5*1021 atoms/cm3). In some embodiments relation of the doping concentrations of doping regions 29 and 28 is in the range between 1 and 1E7 (1-107).

As exemplarily shown in FIG. 3, the first trench control electrode 22 and the lateral control electrode 22-2 may be electrically connected to each other, and the second trench control electrode 22a and the lateral control electrode 22-1 may be electrically connected to each other. In a modification of the embodiment shown in FIG. 3, the electrical connections of the lateral control electrodes 22-1, 22-2 shown in FIG. 3 may be exchanged.

In operation, varying potentials may be applied to the trench control electrodes 22, 22a and the lateral control electrodes 22-1, 22-2. Moreover, a reverse voltage is applied to the readout nodes. Applying the corresponding potentials at the lateral control electrodes 22-1, 22-2 in conjunction with the highly doped regions 29-1, 29-2, 29-3 creates a field distribution that directs the minority carriers to the desired region. The minority carriers are directed to the doping regions 28-1, 28-2 by the lateral control electrodes 22-1, 22-2. Once the minority carriers reach the doping regions 28-1, 28-2 they are stored at the respective control electrode 22-1, 22-2. The effect of this additional doping region 28 is such that the in-phase spatial separation of the photo-generated charge carriers is maintained even across several modulation periods. Thus, photo-generated charge carriers collected once at the respective modulation gates (control electrodes) are not "repelled" again. The minority carriers are stored at the respective control electrode even at the low-phase voltage of the varying potential applied to the control electrodes. Transport of the minority charge carriers to the readout nodes takes place along the length of the control electrodes. Thus, quantum-efficiency modulation takes place. In embodiments, this quantum-efficiency modulation is combined with a drift-field demodulation using the varying potentials applied to the trench control electrodes 22 and 22a.

Generally, the corresponding voltages to be applied to the respective electrodes depend on the doping type of the conversion region and the doping concentration. Generally, the reverse voltage applied to the readout nodes may be the highest voltage, for example in a range of 2.5 to 3.5 volt. The potential applied to the trench and lateral control electrodes may be of the same polarity but substantially lower than the voltages applied to the readout nodes. For example, the potential applied to the control electrodes may vary between 0 and 0.8 volt. The potential applied to separation gate electrodes may be lower than the voltages applied to the readout nodes, but higher than the maximum voltage applied to the control electrodes. For example, the voltages applied to separation gate electrodes may be in a range of 1.0 to 1.5 volt.

In case of a further lateral control electrode (not shown in FIG. 3) between the lateral control electrodes 22-1, 22-2, the voltage applied thereto may be 40 to 80% of the maximum voltage applied to the lateral control electrodes 22-1, 22-2. For example, the voltage applied to the further lateral control electrode may be in a range of 0.4 volt to 0.64 volt. Generally, the lateral control electrode 22-1 and the trench control electrode 22a may be electrically connected to each other. Likewise, the trench control electrode 22 and the lateral control electrode 22-2 may be electrically connected to each other. In other embodiments, a separate control circuitry may be provided to apply the respective varying potentials to the lateral control electrodes and the trench control electrodes.

In embodiments, the photo-generated charge carriers may be directed to respective readout nodes by the electric potential distributions generated by applying varying voltages to the lateral and trench control electrodes. In embodiments, the photo-generated charge carriers may be separated dependent on the time of flight of the electromagnetic signal.

Figure 4A:
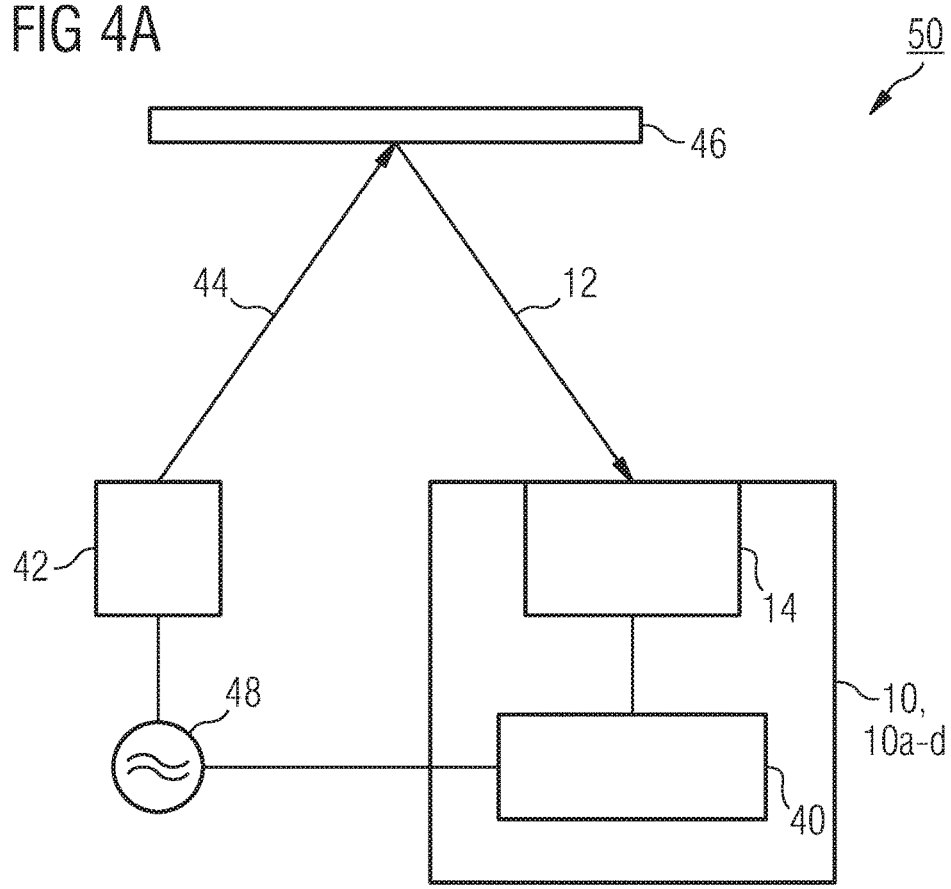
FIG. 4A shows a time of flight sensor system (TOF sensor system) according to an embodiment.

FIG. 4A shows a time of flight sensor system 50 (TOF sensor system) according to an embodiment comprising an optical sensor device 10, 10a-10d as described with respect to FIGS. 1A-1C, FIGS. 2A-2C, and FIG. 3. Alternatively, the optical sensor device 10, 10a-10d may be arranged, for example, as a two-dimensional integrated pixel array. The optical sensor device 10, 10a-10d comprises the semiconductor substrate 14 and the controller 40. The system shown in FIG. 4A further comprises a light source 42, such as a laser. The light source 42 emits an electromagnetic signal 44 to an object 46. The electromagnetic signal 44 is modulated by a modulation signal from a modulator 48. The electromagnetic signal 44 is reflected at the object 46 and the reflected electromagnetic signal 12 is incident on the semiconductor substrate 14 of the optical sensor device 10, 10a-10d.

The measurement principle of this arrangement is based essentially on the fact that the time of flight of the emitted and reflected radiation 44, 12 may be determined based on the phase-shift of the radiation emitted from radiation source 42 and the radiation received at optical sensor device 10, 10a-10d. A modulation signal having a specific modulation frequency is applied to radiation source 42. A demodulation signal in phase with the modulation signal or having a fixed phase relation to the modulation signal is applied to the deep and shallow control electrodes. The modulation signal may be a periodic signal, such as a square wave or a sinusoidal wave. The radiation source 42 emits the radiation signal 44 with a specific phase position. The reflected radiation 12 has a specific phase-shift when compared to the emitted radiation. In the optical sensor device, the signal having the specific phase position of the emitted modulation signal may be mixed with the received signal, wherein the phase-shift may be determined from the resulting signal. To this end, the optical sensor device 10, 10a-10d may be connected to the modulator 48. The controller 40 may apply the modulation signal to the control electrodes 22, 22a to apply the varying potentials in phase with each other thereto. In embodiments, radiation source 42 and modulator 48 may be integrated into the optical sensor device 10, 10a-10d. In embodiments, there may be a fixed known phase-shift between the varying potentials applied to deep and shallow control electrodes and the modulation signal with which radiation source 42 modulates the emitted radiation 44.

Figure 4B:
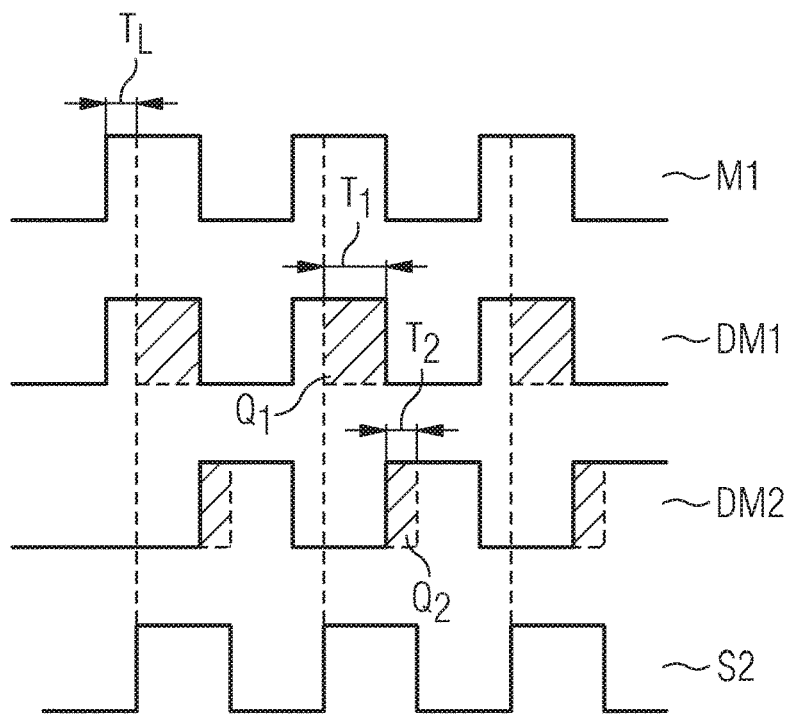
FIG. 4B shows an exemplary timing diagram for explaining the operation of embodiments of optical sensor devices.
Figure 6A:
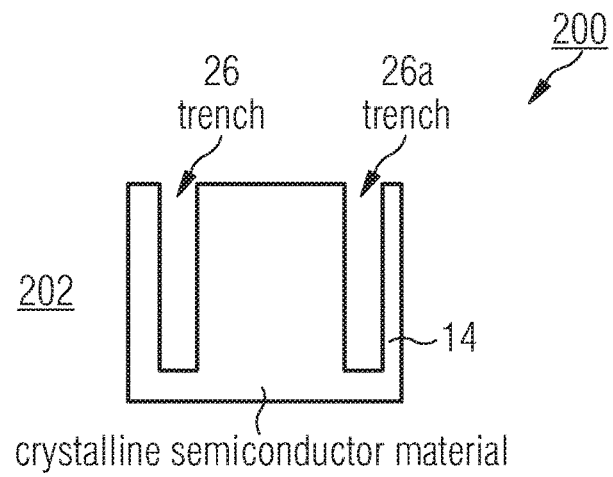
FIGS. 6A-6D show a further exemplary method for manufacturing control electrodes in respective trenches in a semiconductor substrate.
Figure 6B:
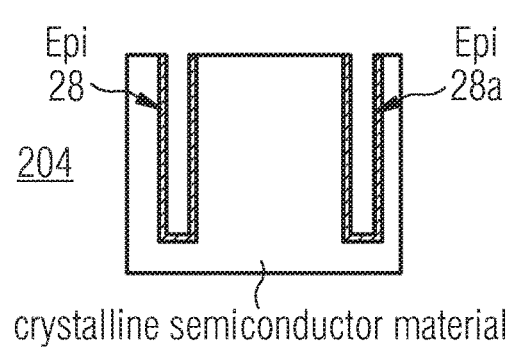
Figure 6C:
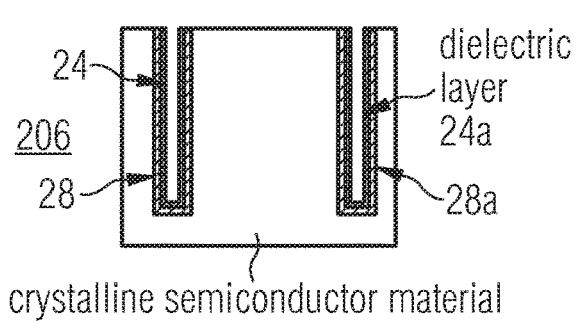
Figure 6D:
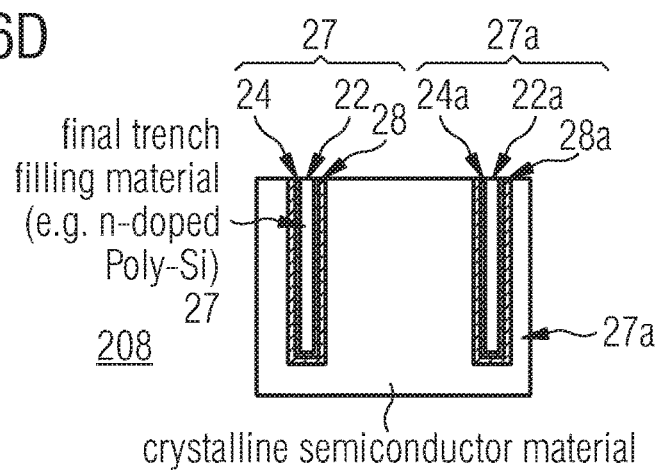

FIG. 4B shows an exemplary timing diagram for explaining the operation of embodiments of optical sensor devices 10, 10a. A principle of phase measurement, which may be applied to embodiments of optical sensor devices comprising first and second deep and shallow control electrodes and first and second readout nodes as described herein, is now shortly explained referring to FIG. 4B. The measurement principle is based substantially on the fact that the time of flight of an emitted electromagnetic signal (light) which is reflected from an object to the optical sensor device may be determined from the phase difference of the emitted signal and the received signal.

In FIG. 4B, S1 represents a modulation signal M1, with which the emitted signal is modulated. Signal S2 represents the electromagnetic signal received at the optical sensor device. Signal DM1 represents a demodulation signal (varying potential) applied to the first control electrode (first modulation gate). Signal DM2 represents a demodulation signal (varying potential) applied to the second control electrode (second modulation gate). Demodulation signal DM2 may have a phase-shift of 180° with respect to demodulation signal DM1. Thus, demodulation signal DM2 may be in anti-phase with respect to demodulation signal DM1.

As indicated in FIG. 4B, there is a phase difference $T_L$ between the signals M1 and S2. This phase difference $T_L$ represents the time of flight of the electromagnetic signal from the source of the electromagnetic signal to the optical sensor device. Assuming that the source of the electromagnetic signal and the optical sensor device are located close to each other, this time of flight may be considered twice the time of flight from the object to the optical sensor device.

The optical sensor device collects photo-generated charge carriers Q1 during the first half of the modulation period in the first readout node and collects the photo-generated carriers Q2 during the second half of the modulation period in the second readout node. The phase-shift $T_L$ and, therefore, the distance from the object, may be determined based on a relationship between the charge carriers Q1 and Q2 collected at the first and second readout nodes. The charge carriers may be collected (integrated) over several modulation periods.

In the following, several possible fabrication methods for fabricating the trench gate elements 22, 22a, 24, 24a, and 28, 28 in respective trenches 26, 26a are described.

The doping regions 28, 28a along the sidewalls of the trenches 26, 26a may be realized in that:

"A"—a species including the desired doping element is implanted;

or

"B"—a layer including the desired doping element is grown epitaxially within the trench;

or

"C"—the desired doping element is out-diffused out of a material including the desired doping element and by which the trench has been filled previously;

or

"D"—a combination of "A", "B", and/or "C" is used.

FIGS. 5A-5G show an exemplary implementation of the method "A" (100) of manufacturing the control electrodes in respective trenches 26, 26a and the additional doping regions 28, 28a in a semiconductor substrate 14, for example as an exemplary sequence of a front-end-of-line (FEOL) process.

In step 102, the trenches 26, 26a have been produced, e.g. by means of a DRIE process (DRIE=Deep reactive-ion etching; or a Bosch process). Subsequently in step 104, a sacrificial oxide 60 is grown on the sidewalls of the trenches 26, 26a. Then, in step 106 the desired doping (doping regions 28, 28a) is introduced into the sidewalls of the trenches 26, 26a via an implantation step. The implantation may be performed in a tilted manner at small angles to the surface normal in the dual or quad mode or by means of plasma immersion implantation in order to obtain doping along the sidewalls of the trenches 26, 26a that is as homogeneous as possible. Subsequently in step 108, the dopant (in the doping regions 28, 28a) is activated by a suitable process, typically short-term heating. Then in step 110, the sacrificial oxide 60 is removed, for example, in a wet-chemical manner, and subsequently in step 112, the final dielectric layer 24, 24a is grown. Subsequently in step 114, the trenches 26, 26a are filled with the desired electrode material, e.g. n-doped Poly-Si, for the control electrodes 22, 22a.

FIGS. 6A-6D show an exemplary implementation of the method "B" (200) of manufacturing the control electrodes in respective trenches 26, 26a and the additional doping regions 28, 28a in a semiconductor substrate 14, for example as an exemplary sequence of a front-end-of-line (FEOL) process.

In step 202, the trenches 26, 26a have been produced, e.g. by means of a DRIE process (DRIE=Deep reactive-ion etching; or a Bosch process). Subsequently, suitable pre-treatment is performed, e.g. cleaning the surface and curing of crystal defects. Then in step 204, a layer including the desired doping element is epitaxially grown in the trenches 26, 26a. Optionally, a further thermal process can follow. Subsequently in step 206, the final dielectric 24, 24a is grown. Subsequently in step 208, the trenches 26, 26a are filled with the desired electrode material, e.g. n-doped Poly-Si, for the control electrodes 22, 22a.

FIGS. 7A-7G show an exemplary implementation of the method "C" (300) of manufacturing the control electrodes in respective trenches 26, 26a and the additional doping regions 28, 28a in a semiconductor substrate 14, for example as an exemplary sequence of a front-end-of-line (FEOL) process.

In step 302, the trenches 26, 26a have been produced, e.g. by means of a DRIE process (DRIE=Deep reactive-ion etching; or a Bosch process). Subsequently, a suitable pre-treatment is performed, e.g. cleaning the surface and curing of crystal defects. Then in step 304, an oxide 62 is grown on the sidewalls of the trenches 26, 26a. Then in step 306, the trenches 26, 26a are filled with a material 64 including the desired doping element. Subsequently in step 308, a thermal process follows that serves to out-diffuse the dopant into the sidewalls of the trenches 26, 26a. Subsequently in step 310, both the material 64 by which the trenches 26, 26a has been filled and the oxide 62 on the sidewalls of the trenches 26, 26a are removed in a wet-chemical manner, for example. Subsequently in step 312, the final dielectric layer 24, 24a is grown. Subsequently in step 314, the trenches 26, 26a are filled with the desired electrode material, e.g. n-doped Poly-Si, for the control electrodes 22, 22a.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. Optical sensor device, comprising:
   a semiconductor substrate comprising a conversion region configured to convert an electromagnetic signal into photo-generated charge carriers in the conversion region;
   a read-out node configured to read-out a first portion of the photo-generated charge carriers;
   a control electrode; and
   a doping region arranged in the semiconductor substrate between the control electrode and the conversion region, wherein the doping region is adjacent to the control electrode and extends into the semiconductor substrate, wherein the doping region has a doping type different from the read-out node, and wherein the doping region has a doping concentration such that the doping region remains completely depleted during operation of the optical sensor device.

2. The optical sensor device according to claim 1, wherein the doping concentration of the doping region is by a factor less than 1000 higher than a doping concentration of the conversion region.

3. The optical sensor device according to claim 1, wherein the optical sensor device is configured to detect a time of flight of the electromagnetic signal that enters the conversion region, the optical sensor device further comprising:
   a controller configured to apply a varying potential to the control electrode, to generate electric potential distributions in the conversion region, by which the photo-generated charge carriers in the conversion region are directed towards the doped region in different directions dependent on the time of flight of the electromagnetic signal,
   wherein the readout node is configured to detect a first portion of the directed photo-generated charge carriers.

4. The optical sensor device according to claim 3, wherein the varying potential is a demodulation signal having a fixed phase relationship with a modulation signal with which the electromagnetic signal is modulated.

5. The optical sensor device according to claim 3, wherein the first portion of the directed photo-generated charge carriers is temporarily stored in the doping region for a least one complete cycle of the varying potential.

6. The optical sensor device according to claim 1, wherein the readout node is configured to detect the first portion of the photo-generated charge carriers.

7. The optical sensor device according to claim 1, wherein the control electrode is separated from the semiconductor substrate by an isolating material.

8. The optical sensor device according to claim 1, wherein the control electrode extends laterally on a surface area of the semiconductor substrate, and wherein the doping region in the semiconductor substrate is adjacent to the laterally-extending control electrode.

9. The optical sensor device according to claim 8, wherein the laterally-extending control electrode comprises a plurality of laterally-extending control electrode sections.

10. The optical sensor device according to claim 9, further comprising:
a shallow doped region arranged between the plurality of laterally-extending control electrode sections, wherein the shallow doped region has a higher doping concentration than the doping concentration of the doping region.

11. The optical sensor device according to claim 10, wherein the doping region has a peak doping concentration between 5E14 and 5E17 atoms/cm3 and the shallow doped region has a peak doping concentration between 5E17 and 5E21 atoms/cm3.

12. The optical sensor device according to claim 1, wherein the control electrode is formed in a trench extending into the semiconductor substrate, and wherein the doping region is adjacent to the trench.

13. The optical sensor device according to claim 12, wherein the doping region is arranged between the control electrode and the conversion region, and wherein the doping region is arranged adjoining the trench.

14. The optical sensor device according to claim 12, wherein, in a plan view of the semiconductor substrate, a lateral extension of the doping region is less than 20% of a lateral extension of the conversion region.

15. The optical sensor device according to claim 12, further comprising:
a further read-out node configured to read-out a second portion of the photo-generated charge carriers,
a further control electrode, which is formed in a further trench extending into the semiconductor substrate; and
a further doping region arranged in the semiconductor substrate, wherein the further doping region is adjacent to the further trench, and wherein the further doping region has a doping type different from the read-out node,
wherein the further doping region has a doping concentration such that the further doping region remains depleted during operation of the optical sensor device.

16. The optical sensor device according to claim 15, wherein the further doping region is arranged adjoining the further trench.

17. The optical sensor device according to claim 15, wherein, in a plan view of the semiconductor substrate, the conversion region is arranged between the control electrode and the further control electrode.

18. The optical sensor device according to claim 15, wherein the doping region and the further doping region have a same doping concentration.

19. The optical sensor device according to claim 15, wherein, in a plan view of the semiconductor substrate, a lateral extension of the doping region and a lateral extension of the further doping region is less than 20% of a distance between the trench and the further trench.

20. The optical sensor device according to claim 15, wherein, in a plan view of the semiconductor substrate, the control electrode and the further control electrode, and the readout node and the further readout node are arranged symmetrically with respect to an axis of symmetry.

21. The optical sensor device according to claim 15, wherein the controller is configured to apply to the further control electrode varying electrical potentials, to apply to the control electrode varying electrical potentials having a phase shift when compared to the varying electrical potentials applied to the further control electrode, to generate electric potential distributions in the conversion region, by which the photo-generated charge carriers in the conversion region are directed dependent on the time of flight of the electromagnetic signal; and
wherein the further readout node is configured to detect the second portion of the directed photo-generated charge carriers.

22. The optical sensor device according to claim 15, wherein the doping region comprises a p-doped semiconductor material, and wherein the control electrode and the further control electrode comprise an n+-doped poly-silicon material as a conductive electrode material.

23. The optical sensor device according to claim 15, wherein the doping region comprises an n-doped semiconductor material, and wherein the control electrode and the further control electrode comprise a p+-doped poly-silicon material as a conductive electrode material.

24. The optical sensor device according to claim 15, wherein the controller is configured to determine the time of flight of the electro-magnetic signal based on a relationship of an amount of charge carriers collected at the readout node and an amount of charge carriers collected at the further readout node.

25. The optical sensor device according to claim 12, wherein the control electrode comprises a plurality of control electrode sections which are formed in a plurality of trenches extending into the semiconductor substrate, and
the optical sensor device comprises a plurality of doping regions arranged in the semiconductor substrate, each of the plurality of doping regions being arranged adjacent to one of the plurality of trenches.

26. The optical sensor device according to claim 1, wherein the doping region is adjacent to the control electrode such that no conductive region in the semiconductor substrate is disposed between the control electrode and the doping region.

27. The optical sensor device according to claim 1, wherein the doping region is contiguous to the control electrode.

28. The optical sensor device according to claim 1, further comprising:
an insulating layer disposed at the control electrode, and wherein the doping region is contiguous to the insulating layer.

* * * * *